US011874301B2

(12) United States Patent
Negishi et al.

(10) Patent No.: US 11,874,301 B2
(45) Date of Patent: Jan. 16, 2024

(54) PROBE SYSTEMS INCLUDING IMAGING DEVICES WITH OBJECTIVE LENS ISOLATORS, AND RELATED METHODS

(71) Applicant: FormFactor, Inc., Livermore, CA (US)

(72) Inventors: Kazuki Negishi, Hillsboro, OR (US);
Yu-Wen Huang, Tigard, OR (US);
Gerald Lee Gisler, St. Paul, OR (US);
Eric Robert Christenson, Tualatin, OR (US); Michael E. Simmons, Colton, OR (US)

(73) Assignee: FormFactor, Inc., Livermore, CA (US)

( * ) Notice: Subject to any disclaimer, the term of this patent is extended or adjusted under 35 U.S.C. 154(b) by 575 days.

(21) Appl. No.: 17/078,778

(22) Filed: Oct. 23, 2020

(65) Prior Publication Data

US 2021/0132115 A1 May 6, 2021

Related U.S. Application Data

(60) Provisional application No. 62/931,581, filed on Nov. 6, 2019.

(51) Int. Cl.
*G01R 1/07* (2006.01)
*G01R 31/308* (2006.01)
*G01R 31/319* (2006.01)

(52) U.S. Cl.
CPC ............ *G01R 1/07* (2013.01); *G01R 31/308* (2013.01); *G01R 31/31905* (2013.01)

(58) Field of Classification Search
CPC .. G01R 1/07; G01R 31/308; G01R 31/31905; G01R 1/071; G01R 29/0835
See application file for complete search history.

(56) References Cited

U.S. PATENT DOCUMENTS

2007/0290703 A1 12/2007 Hollman
2009/0076329 A1 3/2009 Su et al.
(Continued)

FOREIGN PATENT DOCUMENTS

JP  H09102899  4/1997

OTHER PUBLICATIONS

English-language machine translation of Japanese Patent Publication No. JPH09102899, Apr. 15, 1997.

*Primary Examiner* — Lee E Rodak
(74) *Attorney, Agent, or Firm* — KOLITCH ROMANO DASCENZO GATES LLC

(57) ABSTRACT

Probe systems including imaging devices with objective lens isolators and related methods are disclosed herein. A probe system includes an enclosure with an enclosure volume for enclosing a substrate that includes one or more devices under test (DUTs), a testing assembly, and an imaging device. The imaging device includes an imaging device objective lens, an imaging device body, and an objective lens isolator. In examples, the probe system includes an electrical grounding assembly configured to restrict electromagnetic noise from entering the enclosure volume. In examples, methods of preparing the imaging device include assembling the imaging device such that the imaging device objective lens is at least partially electrically isolated from the imaging device body. In some examples, utilizing the probe system includes testing the one or more DUTs while restricting electrical noise from propagating from the imaging device to the substrate.

20 Claims, 3 Drawing Sheets

(56) References Cited

U.S. PATENT DOCUMENTS

| | | | |
|---|---|---|---|
| 2010/0134792 A1* | 6/2010 | Roussel | G01J 3/2803 |
| | | | 356/326 |
| 2011/0227602 A1 | 9/2011 | Schmidt et al. | |
| 2014/0223612 A1 | 8/2014 | Proksch | |
| 2019/0101567 A1 | 4/2019 | Storm et al. | |
| 2020/0025823 A1 | 1/2020 | Teich et al. | |

* cited by examiner

000
PROBE SYSTEMS INCLUDING IMAGING DEVICES WITH OBJECTIVE LENS ISOLATORS, AND RELATED METHODS

RELATED APPLICATION

This application claims priority to U.S. Provisional Patent Application No. 62/931,581, which is entitled PROBE SYSTEMS WITH ELECTRICAL GROUNDING ASSEMBLIES, was filed on Nov. 6, 2019, and the complete disclosure of which is hereby incorporated by reference.

FIELD OF THE DISCLOSURE

The present disclosure relates generally to probe systems and more specifically to probe systems that utilize electrical isolation structures and/or grounding structures to shield a testing environment from an ambient environment that surrounds the probe system.

BACKGROUND OF THE DISCLOSURE

Probe systems may be utilized to test operation and/or performance of a device under test (DUT). Probe systems generally include one or more probes that may be configured to provide a test signal to the DUT and/or to receive a resultant signal from the DUT. By measuring the response of the DUT to the test signal (e.g., by measuring the resultant signal, quantifying the resultant signal, and/or comparing the test signal and the resultant signal), the operation and/or performance of the DUT may be quantified.

Under certain circumstances, it may be desirable to test the DUT under controlled environmental conditions. As an example, it may be desirable to test the DUT under low noise conditions, such as by limiting electromagnetic interference (EMI) with the testing process and/or by limiting electromagnetic radiation and/or electric fields within the testing environment. Thus, there exists a need for improved probe systems including imaging devices with objective lens isolators.

SUMMARY OF THE DISCLOSURE

Probe systems including imaging devices with objective lens isolators and related methods are disclosed herein. A probe system includes an enclosure that at least partially defines an enclosure volume configured to at least substantially enclose a substrate that includes one or more devices under test (DUTs). The probe system additionally includes a testing assembly configured to test the one or more DUTs and an imaging device configured to generate an optical image of at least a portion of the probe system. The imaging device includes an imaging device objective lens that extends at least partially within the enclosure, an imaging device body that operatively supports the imaging device objective lens and that is positioned at least partially exterior of the enclosure volume, and an objective lens isolator that at least partially electrically isolates the imaging device objective lens from the imaging device body. In some examples, the probe system further includes an electrical grounding assembly configured to restrict electromagnetic noise from entering the enclosure volume. In some examples, methods of preparing the imaging device include assembling the imaging device such that the imaging device objective lens is at least partially electrically isolated from the imaging device body. In some examples, utilizing the probe system includes testing the one or more DUTs while restricting electrical noise from propagating from the imaging device to the substrate.

DETAILED DESCRIPTION AND BEST MODE OF THE DISCLOSURE

FIGS. 1-5 provide examples of imaging devices 70 that include objective lens isolators 88 and/or of probe systems 10 that include the imaging devices and/or electrical grounding assemblies 100, according to the present disclosure. Elements that serve a similar, or at least substantially similar, purpose are labeled with like numbers in each of FIGS. 1-5, and these elements may not be discussed in detail herein with reference to each of FIGS. 1-5. Similarly, all elements may not be labeled in each of FIGS. 1-5, but reference numbers associated therewith may be utilized herein for consistency. Elements, components, and/or features that are discussed herein with reference to one or more of FIGS. 1-5 may be included in and/or utilized with the subject matter of any of FIGS. 1-5 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 1:
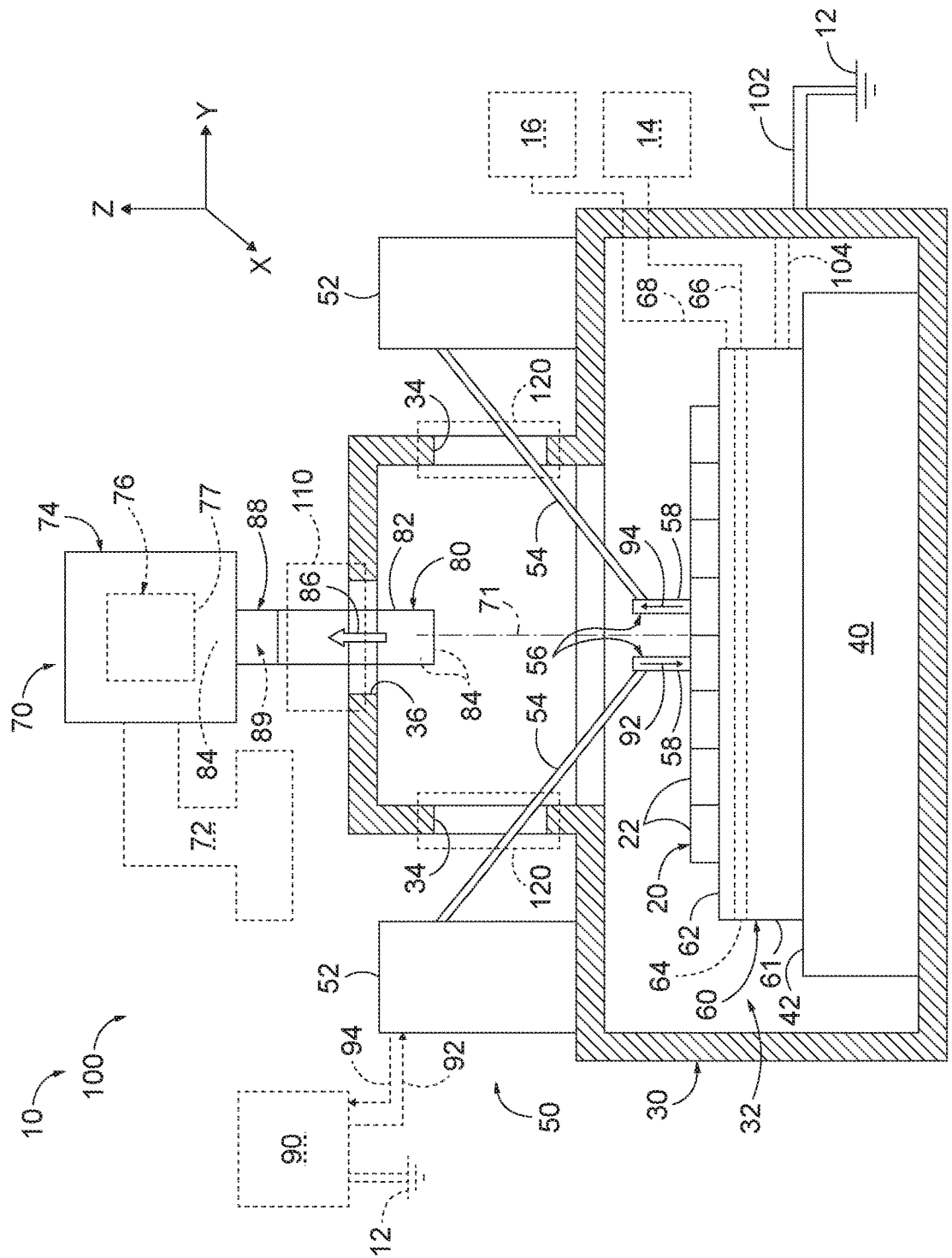
FIG. 1 is a schematic cross-sectional side elevation view of examples of probe systems according to the present disclosure.
Figure 2:
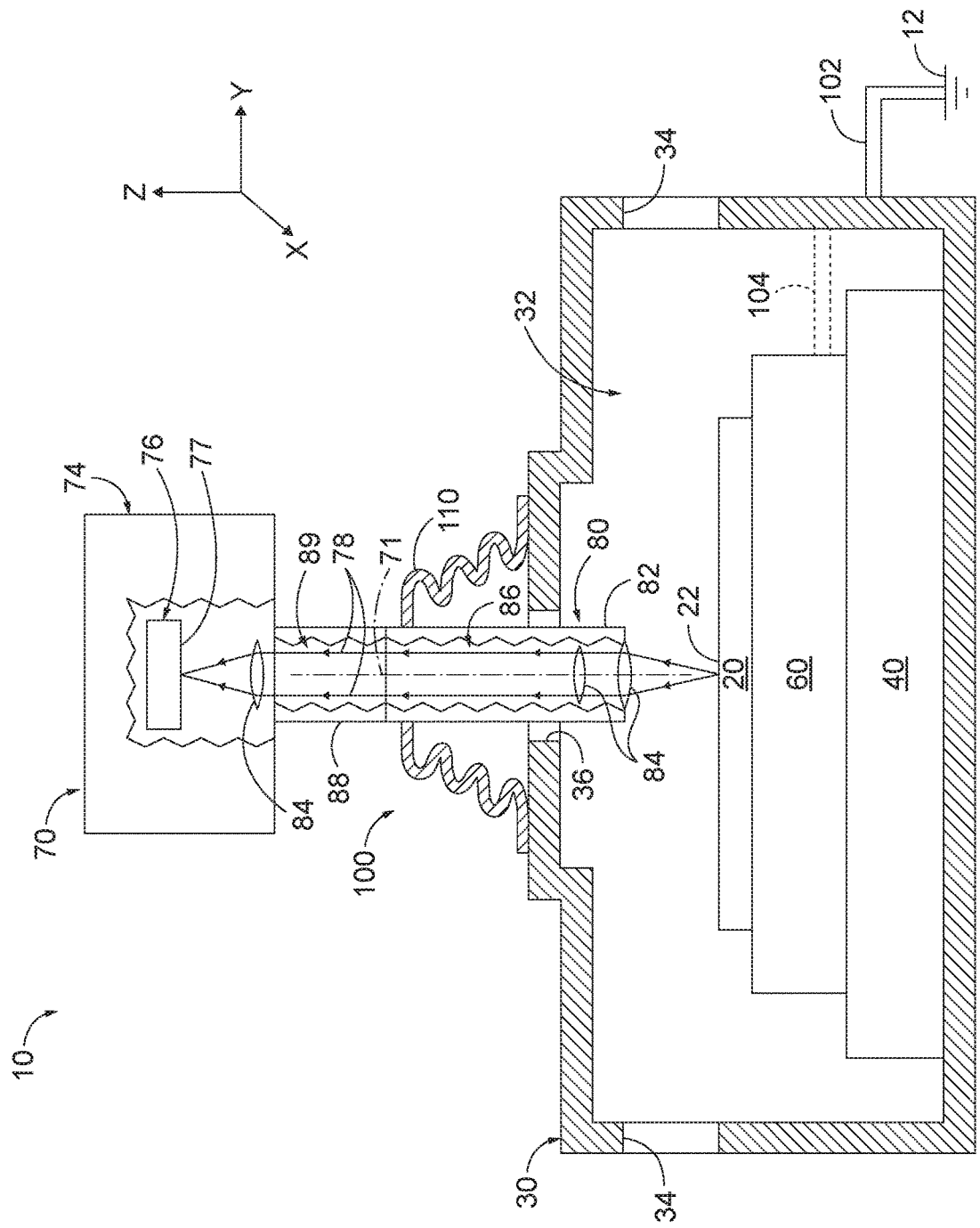
FIG. 2 is a schematic cross-sectional and partial cutaway side elevation view of a portion of an example of a probe system including an electrical grounding assembly with a flexible objective lens grounding conductor according to the present disclosure.
Figure 3:
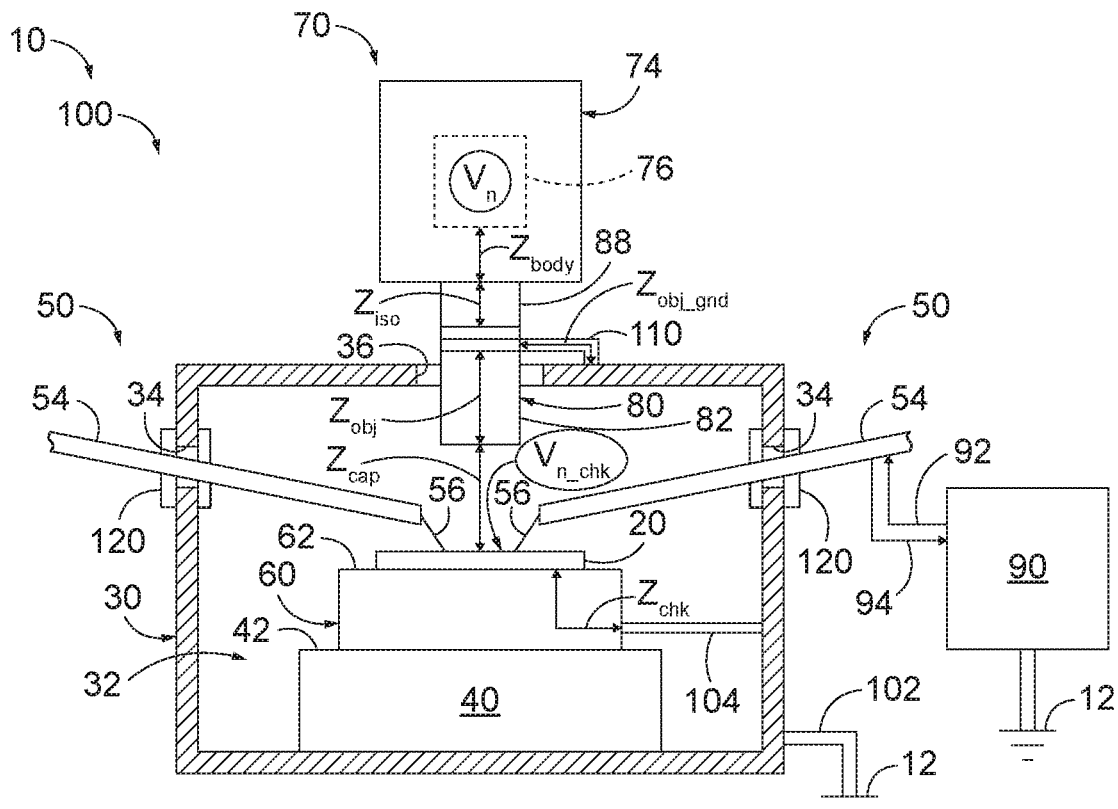
FIG. 3 is a schematic cross-sectional side elevation view of a portion of an example of a probe system according to the present disclosure.

FIGS. 1-3 are schematic illustrations of examples of probe systems 10 including imaging device 70 and/or electrical grounding assemblies 100 according to the present disclosure. In particular, FIG. 1 is a schematic cross-sectional side elevation view of examples of probe systems 10, and FIG. 2 is a slightly less schematic illustration of an example of probe system 10, illustrating a more specific configuration of imaging device 70 and of electrical grounding assembly 100, as described in more detail below. FIG. 3 is a simplified schematic representation of probe systems 10 according to the present disclosure, and schematically illustrates examples of sources and paths of electrical noise, as described in more detail below. Probe systems 10 also may be referred to herein as shielded probe systems 10, test systems 10, grounded probe systems 10, and/or systems 10.

As schematically illustrated in FIGS. 1-3, probe systems 10 may be adapted, configured, designed, shaped, sized, and/or constructed to test one or more devices under test (DUTs) 22 (schematically illustrated in FIGS. 1-2), which may be formed on, supported by, and/or included in a substrate 20. In particular, and as schematically illustrated in FIGS. 1 and 3, probe systems 10 include a testing assembly 50 configured to probe and/or test DUT(s) 22. As schematically illustrated in FIG. 1, substrate 20 may define a normal axis 71 that extends at least substantially perpendicular to the substrate.

Substrate 20 may include and/or be any suitable structure that may support, include, and/or have formed thereon DUT 22. Examples of substrate 20 include a wafer, a semiconductor wafer, a silicon wafer, and/or a gallium arsenide wafer. Similarly, DUT 22 may include and/or be any suitable structure that may be probed and/or tested by probe systems 10. As examples, DUT 22 may include a semiconductor device, an electronic device, an optical device, an imaging device, a CMOS image sensor, a charge-coupled device (CCD) sensor, a logic device, a power device, a switching device, and/or a transistor.

As schematically illustrated in FIGS. 1-3, probe systems 10 additionally include an enclosure 30 that at least partially bounds, encloses, and/or defines an enclosure volume 32. Enclosure volume 32 may be adapted, configured, designed, shaped, sized, and/or constructed to receive and/or at least substantially enclose substrate 20 and/or DUT(s) 22. Enclosure 30 may be an electrically conductive enclosure, and/or may be configured to at least partially shield enclosure volume 32 from the ambient environment that surrounds enclosure 30, that is external to enclosure 30, and/or that is external to enclosure volume 32. As examples, enclosure 30 may shield enclosure volume 32 from electromagnetic radiation that may be present within the ambient environment, from electric fields that may be present within the ambient environment, from magnetic fields that may be present within the ambient environment, and/or from visible light that may be present within the ambient environment.

Enclosure 30 may include and/or be any suitable structure that may define enclosure volume 32 and/or that may house and/or contain at least a portion of substrate 20 and/or DUT 22. For example, enclosure 30 may be an electromagnetically shielded enclosure, such as an enclosure that is formed from an electromagnetic shielding material. Additionally or alternatively, enclosure 30 may be an electrically conductive enclosure, may be a metallic enclosure, and/or may be an electrically shielded enclosure. As additional examples, enclosure 30 may be configured to restrict transmission of ambient light and/or other electromagnetic radiation into enclosure volume 32, such as from an ambient environment exterior of the enclosure. As another example, enclosure 30 may include one or more walls, each of which may at least partially bound enclosure volume 32.

As described herein, enclosure 30 may be configured to provide shielding from electromagnetic radiation for DUT 22 and/or for at least a region, or portion, of testing assembly 50. However, and as discussed in more detail herein, enclosure 30 may include one or more holes, slits, and/or apertures through which other components of probe systems 10 may extend, thereby potentially introducing electrical and/or electromagnetic noise into enclosure volume 32. Accordingly, in some examples, and as described in more detail below, probe systems 10 according to the present disclosure include an electrical grounding assembly 100 for mitigating incursion of electromagnetic noise into enclosure volume 32. Stated differently, in such examples, electrical grounding assembly 100 is configured to restrict electromagnetic noise from entering enclosure volume 32 from exterior of enclosure 30.

As a more specific example, and as schematically illustrated in FIGS. 1-5 and described in more detail herein, electrical grounding assembly 100 may be configured to provide an electrical connection between one or more components of probe systems 10 and an electrical ground 12. As used herein, electrical ground 12 may refer to, include, and/or be any of a variety of structures and/or devices for electrically grounding one or more components of probe systems 10, examples of which include a grounding electrode, a ground potential source, an earth potential source, a common potential source, a charge sink, a charge source, etc. As used herein, the terms "electrically coupled" and "electrically connected" may be used to describe two or more components that are joined by an electrical coupling and/or an electrical connection through which an electric current may pass and/or flow. Additionally or alternatively, the terms "electrically coupled," "electrically connected," and/or "electrical communication" may be used herein to describe an electrical connection that may be characterized by a net electrical resistance of less than 10 Ohms ($\Omega$), less than 5$\Omega$, less than 1$\Omega$, less than 0.5$\Omega$, and/or less than 0.1$\Omega$. Additionally or alternatively, as used herein, the term "direct electrical communication" may be used to describe an electrical coupling and/or an electrical connection that is physically, mechanically, and/or operatively connected to each element that is said to be in direct electrical communication.

As schematically illustrated in FIGS. 1 and 3, probe systems 10 may include a chuck 60 having a chuck support surface 62 that is configured to support substrate 20 and/or DUT(s) 22 during operative use of probe systems 10. Chuck 60 and/or chuck support surface 62 thereof may be located and/or may extend within enclosure volume 32. As also schematically illustrated in FIGS. 1 and 3, probe systems 10 may include a translation stage 40 with a translation stage support surface 42 that supports chuck 60. As schematically illustrated in FIGS. 1-3, translation stage 40 may be located and/or may extend within enclosure volume 32.

Translation stage 40 may be configured to operatively translate chuck 60 relative to probe 56 and/or to operatively rotate chuck 60 relative to probe 56, such as to facilitate alignment between one or more DUTs 22 and probe 56. Additionally or alternatively, translation stage 40 may be configured to operatively translate and/or rotate chuck 60 relative to testing assembly 50 so as to facilitate sequential testing of a plurality of DUTs 22 by the testing assembly, such as by moving substrate 20 relative to the testing assembly such that probe 56 is aligned with a different DUT 22.

In some examples, translation stage 40 may be configured to translate chuck 60 and/or substrate 20 relative to enclosure 30 along a first axis and along a second axis that is perpendicular, or at least substantially perpendicular, to the first axis. The first axis and the second axis may both be parallel, or at least substantially parallel, to translation stage support surface 42. For example, the first axis may be oriented in the X-direction as illustrated in FIGS. 1-2, and/or the second axis may be oriented in the Y-direction as illustrated in FIGS. 1-2.

Translation stage 40 additionally or alternatively may be configured to operatively and/or simultaneously translate chuck 60 and/or substrate 20 relative to enclosure 30 along a third axis that is perpendicular, or at least substantially perpendicular, to translation stage support surface 42. For example, the third axis may be oriented in the Z-direction as illustrated in FIGS. 1-2. Additionally or alternatively, translation stage 40 may be configured to operatively and/or simultaneously rotate chuck 60 and/or substrate 20 about a rotation axis. The rotation axis may be perpendicular, or at least substantially perpendicular, to translation stage support surface 42, and/or may be the third axis.

As schematically illustrated in FIGS. 1-3, and as discussed in more detail herein, probe systems 10 include an imaging device 70 that is configured to generate an optical image of at least a portion of probe systems 10 and/or of DUT 22. In some examples, and as schematically illustrated in FIGS. 1-3, probe systems 10 are configured such that a portion, at least a portion, or only a portion of imaging device 70 extends at least partially through enclosure 30, into enclosure volume 32, and/or within the enclosure volume.

In an example in which imaging device 70 generates and/or conducts electrical noise, the portion of the imaging device extending into enclosure volume 32 thus may operate to introduce the electrical noise into the enclosure volume. Accordingly, in such examples, and as discussed in more detail herein, electrical grounding assembly 100 may include an objective lens grounding conductor 110 that electrically connects a portion of imaging device 70 (such as an imaging device objective lens 80 of imaging device 70) to enclosure 30 and/or to electrical ground 12 to restrict and/or prevent the electrical noise from entering enclosure volume 32.

Additionally or alternatively, and as further discussed in more detail herein, imaging device 70 may include an objective lens isolator 88 that operates to electrically isolate at least a portion of imaging device objective lens 80 from another component of imaging device 70. Thus, the presence of objective lens isolator 88 may restrict electrical and/or electromagnetic noise from being introduced to enclosure volume 32 via the imaging device objective lens.

As used herein, the terms "noise," "electrical noise," "electromagnetic noise," and the like are intended to refer to any form of electrical and/or electromagnetic interference that is introduced, or inadvertently introduced, into enclosure volume 32, such as may interfere with, or increase variation in, testing of DUT(s) 22 by the probe system. As examples, the terms "noise," "electrical noise," "electromagnetic noise," and the like may refer to electromagnetic radiation within an ambient environment that surrounds enclosure 30, an electrical signal and/or current that propagates via an electrical conductor, a randomly varying electric potential, and/or any other transient, random, incidental, and/or otherwise undesirable current and/or radiation that may interfere with an ability of probe systems 10 to test DUT(s) with high precision and/or accuracy.

As discussed, probe systems 10 may include a testing assembly 50 configured to probe and/or test DUT(s) 22. More specifically, in some such examples, and as schematically illustrated in FIG. 1, testing assembly 50 is configured to provide a test signal 92 to DUT(s) 22 and/or to receive a resultant signal 94 from DUT(s) 22. In some examples, and as schematically illustrated in FIG. 1, testing assembly 50 includes one or more probe arms 54, one or more probes 56 supported by each probe arm 54, and/or one or more manipulators 52 for positioning probe arm(s) 54 and/or probe(s) 56 relative to DUT(s) 22.

As schematically illustrated in FIG. 1, each probe 56 may include a corresponding one or more probe tips 58 for interfacing with and/or testing DUT(s) 22. More specifically, and as schematically illustrated in FIG. 1, probe 56 (and/or at least one probe tip 58 thereof) may be configured to provide a corresponding test signal 92 to DUT 22 and/or to receive a corresponding resultant signal 94 from DUT 22.

Test signal 92 may include and/or be a direct current test signal, an alternating current test signal, an analog test signal, and/or a digital test signal. In some examples, and as schematically illustrated in FIGS. 1 and 3, probe systems 10 additionally include a signal generation and analysis assembly 90 that is configured to provide test signal 92 to testing assembly 50 and/or to receive resultant signal 94 from testing assembly 50.

Signal generation and analysis assembly 90 may include and/or be any suitable device or devices that are configured to perform the functions discussed herein. For example, the signal generation and analysis assembly may include one or more of an electronic controller, a dedicated controller, a special-purpose controller, a personal computer, a special-purpose computer, a display device, a logic device, a memory device, and/or a memory device having non-transitory computer readable media suitable for storing computer-executable instructions for implementing aspects of systems according to the present disclosure. Examples of such media include CD-ROMs, disks, hard drives, flash memory, etc. As used herein, storage, or memory, devices and media having computer-executable instructions as well as computer-implemented methods and other methods according to the present disclosure are considered to be within the scope of subject matter deemed patentable in accordance with Section 101 of Title 35 of the United States Code.

Signal generation and analysis assembly 90 additionally or alternatively may include and/or be any suitable structure that may, or that may be configured to, generate test signal 92, transmit test signal 92, receive resultant signal 94, and/or analyze resultant signal 94. Examples of signal generation and analysis assembly 90 include a signal generator, an electric signal generator, an optical signal generator, a wireless signal generator, an electromagnetic signal generator, a signal detector, an electric signal detector, an optical signal detector, a wireless signal detector, and/or an electromagnetic signal detector.

Each probe 56 and/or each probe tip 58 may be configured to test the corresponding DUT 22 in any appropriate manner, such as to perform contact and/or non-contact testing of DUT 22. For example, each probe tip 58 may be configured to contact, to electrically contact, and/or to facilitate communication with, DUT 22. As a more specific example, probe tip 58 may be configured to electrically contact a contact pad of DUT 22 during operative use of probe systems 10.

However, this is not required of all examples of probe systems 10, and it is additionally or alternatively within the scope of the present disclosure that probe 56 and/or probe tip 58 may be configured for non-contact testing of DUT 22. For example, one or more probe tips 58 may be configured to provide test signal 92 to DUT 22 and/or to receive resultant signal 94 from DUT 22 via an electromagnetic and/or optical coupling. In such examples, each such probe tip 58 may be configured to be spaced apart from DUT 22 during operative use of probe systems 10. Each probe 56 may include and/or be any appropriate probe, such as a needle probe. In some examples, testing assembly 50 includes a probe head assembly that includes the plurality of probe tips 58 and/or a corresponding plurality of probes 56.

As used herein, the terms "operative use," "operatively utilized," and the like, as used to describe a configuration in which probe systems 10 operate to test DUT(s) 22, generally relate to examples in which the probe system supports the substrate and in which testing assembly 50 is operable to test at least one DUT on substrate 20. For example, probe systems 10 and/or testing assembly 50 may be described as being in operative use when at least one probe 56 of the testing assembly is positioned to engage and/or interface with DUT 22, is configured to provide test signal 92 to the DUT, and/or is configured to receive resultant signal 94 from the DUT. However, such descriptions are not limiting with respect to the structures and components described herein, and it is to be understood that the structures and components disclosed herein do not require that probe systems 10 and/or testing assembly 50 always be in operative use and/or operatively positioned relative to substrate 20 and/or DUT(s) 22.

As discussed, and as schematically illustrated in FIGS. 1-3, each probe 56 may be selectively and/or operatively positioned relative to the corresponding DUT 22 with a corresponding manipulator 52. Each manipulator 52 may include and/or be any suitable structure that may be operatively attached to enclosure 30 and/or that may be configured to operatively translate each probe arm 54 and/or each probe 56. Manipulator 52 may be configured to maintain a fixed, or at least substantially fixed, relative orientation among probe arm 54, probe 56, probe tip 58, and DUT 22 during operative use of probe systems 10.

During operation of probe system 10 of FIG. 1, each manipulator 52 may be utilized to operatively translate probe(s) 56 throughout a probe range-of-motion, thereby operatively translating probe tip(s) 58 relative to DUT 22. As an example, one or more manipulators 52 may be utilized to operatively align one or more probe tips 58 with specific, target, and/or desired locations on DUT 22, such as to permit communication between the corresponding probes and the DUT. This may include operative translation of probes 56 in a plurality of different, separate, distinct, perpendicular, and/or orthogonal directions, such as the X-, Y-, and/or Z-directions that are illustrated in FIG. 1.

In the example of FIG. 1, the X- and Y-directions may be parallel, or at least substantially parallel, to an upper surface of substrate 20, while the Z-direction may be perpendicular, or at least substantially perpendicular, to the upper surface of substrate 20. As further schematically illustrated in FIG. 1, the Z-direction may be at least substantially parallel to normal axis 71. However, this specific configuration is not required.

Each manipulator 52 may include and/or be any suitable structure that may be operatively attached to probe 56, such as via probe arm 54, and/or that may be configured to operatively translate probe 56 throughout the probe range-of-motion, such as may extend in three orthogonal, or at least substantially orthogonal, axes, such as the X-, Y-, and Z-axes of FIG. 1. As examples, manipulator 52 may include one or more translation stages, lead screws, ball screws, rack and pinion assemblies, motors, stepper motors, electrical actuators, mechanical actuators, micrometers, and/or manual actuators. Manipulator 52 may be a manually actuated manipulator and/or an automated, or electrically actuated, manipulator.

As schematically illustrated in FIG. 1, each manipulator 52 may be external to enclosure volume 32, such that the corresponding probe 56 may be oriented within enclosure volume 32 with the corresponding probe arm 54 operatively connecting the manipulator to the corresponding probe. As schematically illustrated in FIG. 1, each manipulator 52 may directly engage enclosure 30, may be operatively attached to the enclosure, and/or may be at least partially supported by the enclosure. However, this is not required of all examples of probe systems 10, and it is additionally within the scope of the present disclosure that each manipulator 52 may be spatially separated from enclosure 30.

As schematically illustrated in FIG. 1, probe systems 10 generally are configured such that a portion of testing assembly 50 extends through enclosure 30 and into enclosure volume 32. More specifically, and as schematically illustrated in FIGS. 1-3, enclosure 30 may include and/or define one or more probe arm slits 34, and each probe arm 54 (schematically illustrated in FIGS. 1 and 3) may extend from a corresponding manipulator 52 through a corresponding probe arm slit 34 and into enclosure volume 32 to position probe 56 and/or probe tip 58 thereof (schematically illustrated in FIG. 1) proximate to substrate 20 and/or DUT 22 (schematically illustrated in FIG. 1). Probe arm slit 34 also may be referred to herein as a probe arm aperture 34.

As discussed, imaging device 70 generally is configured to generate an optical image, or a spatial representation, of at least a portion of probe systems 10 and/or of substrate 20. For example, imaging device 70 may be configured and/or positioned to generate an optical image of probe 56 and/or of probe tip 58, and/or to generate an optical image of substrate 20 and/or of DUT 22, such as to facilitate alignment of probe tip 58 relative to DUT 22 with manipulator(s) 52 and/or with translation stage 40. As schematically illustrated in FIGS. 1-2, imaging device 70 may be configured to receive light for forming an optical image along any appropriate direction, such as a direction that is at least substantially parallel to normal axis 71 and/or to the Z-direction as illustrated in FIGS. 1-2.

In some examples, and as schematically illustrated in FIG. 1, probe systems 10 include an imaging device support structure 72 that supports at least a portion of imaging device 70 relative to enclosure 30. In some such examples, imaging device support structure 72 may be configured to selectively translate and/or rotate at least a portion of imaging device 70 relative to enclosure 30 and/or relative to substrate 20, such as to bring different regions of the probe systems 10 and/or of the substrate into focus. As a more specific example, imaging device support structure 72 may be configured to selectively translate and/or rotate imaging device objective lens 80 relative to enclosure 30 and/or relative to substrate 20. In some examples, imaging device body 74 may include imaging device support structure 72, and/or imaging device objective lens 80 may be configured to rotate and/or translate relative to at least a portion of imaging device body 74.

Imaging device 70 may include and/or be any suitable structure that may be adapted, configured, designed, and/or constructed to generate one or more optical images of probe systems 10 and/or of DUT 22. As examples, imaging device 70 may include and/or be a microscope, a microscope that includes an eyepiece, a microscope that does not include an eyepiece, a camera, a charge-coupled device, an imaging sensor, a solid state imaging device, a C-MOS imaging device, an infinity-corrected optical system, and/or a lens.

As discussed, and as schematically illustrated in FIGS. 1-3, imaging device 70 may include imaging device objective lens 80 that is configured to collect light for generating the optical image of probe systems 10 and/or of DUT 22, as well as an imaging device body 74 that operatively supports imaging device objective lens 80. Imaging device 70 may include any of a variety of structures and/or components for generating the optical image. For example, and as schematically illustrated in FIGS. 1-2, imaging device 70 may include one or more optical elements 84 configured to receive light rays 78 (schematically illustrated in FIG. 2) and to direct the light rays at least partially along an optical path 86 that extends within the imaging device. As schematically illustrated in FIGS. 1-2, imaging device body 74 may enclose and/or support at least one optical element 84. Similarly, and as schematically illustrated in FIGS. 1-2, imaging device objective lens 80 may include an objective housing 82 that encloses and/or supports at least one optical element 84. Each optical element 84 may include and/or be any of a variety of optical elements, examples of which include a lens, a tube lens, a converging lens, a diverging lens, and/or a mirror.

As schematically illustrated in FIGS. 1-3, imaging device 70 may be positioned at least partially exterior of enclosure 30 and/or of enclosure volume 32. For example, and as schematically illustrated in FIGS. 1-3, imaging device body 74 may be positioned at least partially, at least substantially, and/or fully exterior of enclosure 30, and imaging device objective lens 80 may extend at least partially into enclosure 30 and/or within enclosure volume 32. As a more specific example, and as further schematically illustrated in FIGS. 1-3, enclosure 30 may include and/or define an imaging device aperture 36, and at least a portion of imaging device 70 (such as imaging device objective lens 80) may extend at least partially within and/or through imaging device aperture 36 and/or into enclosure volume 32.

As still more specific examples, imaging device objective lens 80 may extend partially within imaging device aperture 36, may extend fully through the imaging device aperture, and/or may extend into enclosure volume 32 via imaging device aperture 36. In such examples, it may be desirable to limit an extent to which imaging device objective lens 80 extends exterior of enclosure volume 32, such as to limit an extent to which the imaging device objective lens may receive and/or conduct electromagnetic signals from exterior of enclosure 30. Additionally or alternatively, in such examples, it may be desirable that at least a portion of imaging device 70, such as imaging device body 74, remain exterior of enclosure 30 and/or of enclosure volume 32 in order to restrict electrical and/or electromagnetic noise from entering enclosure volume 32. For example, and as schematically illustrated in FIG. 1, imaging device support structure 72 may support imaging device body 74 exterior of enclosure volume 32.

When present, imaging device body 74 may include and/or enclose electronics and/or circuits associated with imaging device 70 that generate electromagnetic noise. Accordingly, even when imaging device body 74 is positioned exterior of enclosure 30, an electrical connection between imaging device body 74 and imaging device objective lens 80 may operate to introduce such electromagnetic noise into enclosure volume 32 via imaging device aperture 36.

In some examples, and as schematically illustrated in FIGS. 1-3 and described in more detail herein, imaging device 70 additionally includes objective lens isolator 88 that at least partially electrically isolates imaging device objective lens 80 from imaging device body 74. For example, and as schematically illustrated in FIGS. 1-3, objective lens isolator 88 may be positioned at least partially between imaging device body 74 and imaging device objective lens 80 such that the objective lens isolator at least partially spatially separates the imaging device objective lens from the imaging device body. In such examples, imaging device body 74 may be described as operatively supporting imaging device objective lens 80 via objective lens isolator 88. Stated differently, in such examples, imaging device body 74 may be operatively coupled to and support objective lens isolator 88, which in turn may be operatively coupled to and support imaging device objective lens 80, such that the imaging device body, the objective lens isolator 88, and the imaging device objective lens 80 are maintained in an at least substantially fixed configuration relative to one another during operative use of probe systems 10.

In some examples, objective lens isolator 88 operates to at least substantially electrically isolate imaging device objective lens 80 from imaging device body 74. Specifically, objective lens isolator 88 may restrict and/or prevent electrical currents and/or electromagnetic noise from propagating from imaging device body 74 to imaging device objective lens 80 via an electrically conductive path, may decrease inductive coupling between the imaging device body and the objective lens, and/or may decrease capacitive coupling between the imaging device body and the objective lens.

In this manner, objective lens isolator 88 may operate to electrically isolate imaging device objective lens 80 from electromagnetic noise that is generated by electronics associated with imaging device 70. For example, objective housing 82 may be at least partially formed of an electrically conductive material, such as a metal. Thus, in examples of imaging device 70 that do not include objective lens isolator 88, objective housing 82 may operate to conduct electrical and/or electromagnetic noise within enclosure 30. Moreover, in some examples, and as schematically illustrated in FIGS. 1-2, imaging device 70 may include imaging device control circuitry 76, such as may be supported by and/or enclosed by imaging device body 74, which may generate electrical and/or electromagnetic noise.

Thus, in a configuration in which imaging device body 74 is electrically connected to objective housing 82, electrical noise may propagate from imaging device control circuitry 76 to objective housing 82 and potentially into enclosure volume 32. However, in an example in which objective lens isolator 88 electrically isolates imaging device objective lens 80 from imaging device body 74, the objective lens isolator may restrict and/or prevent electrical noise associated with imaging device control circuitry 76 from reaching imaging device objective lens 80 and/or enclosure volume 32.

When present, imaging device control circuitry 76 may be configured to perform any of a variety of functions that enable and/or facilitate generating an optical image. As examples, imaging device control circuitry 76 may be configured to control operation of imaging device support structure 72 to selectively reposition at least a portion of imaging device 70 relative to enclosure 30 and/or relative to substrate 20. Additionally or alternatively, imaging device control circuitry 76 may be configured to generate and/or transmit the optical image corresponding to light rays 78 that reach imaging device body 74.

As a more specific example, and as schematically illustrated in FIGS. 1-2, imaging device control circuitry 76 may include an image sensor 77 that is configured to collect electromagnetic radiation (e.g., light rays 78) incident thereon from optical path 86 and to generate the optical image based upon the collected electromagnetic radiation. Accordingly, in such examples, optical path 86 may extend from imaging device objective lens 80 to imaging device body 74, to imaging device control circuitry 76, and/or to image sensor 77. Additionally or alternatively, imaging device control circuitry 76 may be configured to receive an electrical power signal for operating at least a portion of imaging device 70.

Objective lens isolator 88 may include and/or be any of a variety of structures that electrically isolate imaging device objective lens 80 as described herein, examples of which include a hollow structure, a cylindrical structure, and/or a hollow cylindrical structure. In some examples, such as when objective lens isolator 88 includes a hollow structure, objective lens isolator 88 contains, encloses, and/or forms a portion of optical path 86 between imaging device objective lens 80 and imaging device body 74. For example, and as schematically illustrated in FIG. 2, optical path 86 of light rays 78 may extend at least partially and/or fully through objective lens isolator 88. In such examples, and as schematically illustrated in FIGS. 1-2, objective lens isolator 88 may be described as including, enclosing, and/or defining an isolator cavity 89 such that optical path 86 extends within isolator cavity 89 (as best seen in FIG. 2).

Objective lens isolator 88 may be formed of any of a variety of materials, examples of which include an electrically insulating material, a plastic material, a dielectric material, and/or a thermo-plastic material. As a more specific example, objective lens isolator 88 may be formed of a material that has an electrical resistivity that is greater than that of imaging device body 74 and/or of imaging device objective lens 80, thereby restricting electrical current from propagating between the imaging device body and the imaging device objective lens. Objective lens isolator 88 may be formed of a material that has any of a variety of electrical resistivities suitable for restricting flow of electric current, examples of which include a material with an electrical resistivity that is greater than 1 Ohm-centimeter ($\Omega$-cm), greater than 1,000 $\Omega$-cm, and/or greater than 1,000,000 $\Omega$-cm. As another example, objective lens isolator 88 may be formed of a material that has a dielectric constant that is smaller than that of imaging device body 74 and/or of imaging device objective lens 80, thereby restricting electrical current from propagating between the imaging device body and the imaging device objective lens via capacitive transmission. As more specific examples, objective lens isolator 88 may be formed of a material with a dielectric constant that is less than 50, less than 10, less than 5, and/or less than 2.

While the present disclosure generally relates to examples in which objective lens isolator 88 and imaging device objective lens 80 are distinct structures, this is not required of all examples of imaging device 70. For example, it is additionally within the scope of the present disclosure that imaging device objective lens 80 may include and/or define at least a portion of objective lens isolator 88. As a more specific example, objective housing 82 may include and/or define at least a portion of objective lens isolator 88, such as in an example in which at least a portion of the objective housing is formed of an electrically insulating material. In such examples, objective lens isolator 88 may be described as electrically isolating at least a portion of imaging device objective lens 80 when objective housing 82 operates to at least partially restrict electrical and/or electromagnetic noise from propagating from imaging device body 74 to a component of the imaging device objective lens, such as a component of the imaging device objective lens that extends within imaging device aperture 36 and/or enclosure volume 32.

In some examples, imaging device 70 and/or imaging device objective lens 80 may include and/or be an infinity-corrected optical system. In such examples, and as schematically illustrated in FIG. 2, imaging device 70 may be configured such that light rays 78 traveling along optical path 86 within imaging device 70 are at least substantially collimated (e.g., at least substantially parallel to one another) within at least a portion of the optical path, such as a portion of the optical path that extends between imaging device objective lens 80 and imaging device body 74. As a more specific example, imaging device 70 may be configured such that light rays 78 traveling along optical path 86 are at least substantially collimated within a portion of the optical path that extends through objective lens isolator 88.

Thus, in such examples, optical path 86 of imaging device 70 may be configured such that optical path 86 may pass through objective lens isolator 88 without the objective lens isolator adversely affecting the performance of imaging device 70 to collect light rays 78 with imaging device objective lens 80. Stated differently, in such examples, the collimation of light rays 78 in optical path 86 between imaging device objective lens 80 and imaging device body 74 enables variation of a separation distance between the imaging device objective lens and the imaging device body without substantial detrimental effect on the focus of the optical image. Thus, in such examples, a focusing capability of imaging device 70 is at least substantially unaffected by the presence of objective lens isolator 88 and/or by a length of the objective lens isolator (e.g., as measured along a direction parallel to normal axis 71).

In some examples, and as discussed, probe systems 10 according to the present disclosure are configured to provide electrical shielding to enclosure volume 32. Stated differently, probe systems 10 may include one or more structures for reducing, minimizing, and/or eliminating electrical noise and/or electromagnetic interference within enclosure volume 32, such as to facilitate low-noise measurements of DUT 22 with testing assembly 50. As an example, and as discussed, enclosure 30 may include and/or be an electrically conductive enclosure 30 that is maintained at an electric potential that is at least substantially constant. As a more specific example, enclosure 30 may be maintained at least substantially at a ground potential. As used herein, a component that is maintained at an electrical ground potential also may be described as being grounded, as being electrically grounded, and/or as being electrically coupled to a ground.

In an example in which enclosure 30 is an electrically conductive enclosure 30 that is grounded, enclosure 30 may operate to restrict and/or prevent electromagnetic interference from entering enclosure volume 32 from exterior of enclosure 30. In this manner, enclosure 30 may be described as operating as a Faraday cage. However, one or more components of probe systems 10 that extend into enclosure volume 32, such as via probe arm slit 34 and/or via imaging device aperture 36, may operate to introduce electrical noise into enclosure volume 32.

As an example, absent appropriate grounding and/or shielding, each probe arm 54 may effectively operate as an antenna for electromagnetic noise that exists exterior of enclosure 30, such as may be generated by and/or associated with components of probe systems 10 that are positioned exterior of enclosure 30. In such examples, each probe arm 54 thus may introduce the electromagnetic noise into enclosure volume 32 via each probe arm slit 34.

As another example, absent appropriate grounding and/or shielding, imaging device 70, imaging device body 74, and/or imaging device objective lens 80 may operate as an antenna for electromagnetic noise that exists exterior of enclosure 30 and/or may conduct electromagnetic noise generated within imaging device body 74. In such examples, a portion of imaging device 70 that extends through imaging device aperture 36 (such as imaging device objective lens 80) thus may introduce the electromagnetic noise into enclosure volume 32 via imaging device aperture 36. However, when present, and as discussed, objective lens isolator 88 is configured to restrict electrical and/or electromagnetic noise from propagating from imaging device body 74 to imaging device objective lens 80, thereby mitigating the introduction of electromagnetic noise into enclosure volume 32.

To further reduce, minimize, and/or eliminate the introduction of electromagnetic noise into enclosure volume 32, and as schematically illustrated in FIGS. 1-3, probe systems 10 according to the present disclosure additionally may include electrical grounding assembly 100. Electrical grounding assembly 100 may be configured to shield enclosure volume 32 from electromagnetic radiation that may be present in the ambient environment, from electric fields that may be present within the ambient environment, and/or from magnetic fields that may be present in the ambient environment. More specifically, and as described herein, electrical grounding assembly 100 generally is configured to provide an electrical connection between one or more components of probe systems 10, enclosure 30, and/or an external electrical ground 12.

Electrical grounding assembly 100 may include and/or be any of a variety of structures for providing electrical connections as described herein. In some examples, and as schematically illustrated in FIGS. 1-3, electrical grounding assembly 100 includes an enclosure grounding conductor 102 that electrically connects enclosure 30 to electrical ground 12. For example, and as discussed, enclosure 30 may be an electrically conductive enclosure 30, such that electrically connecting enclosure 30 to electrical ground 12 operates to maintain enclosure 30 at ground potential. In this manner, enclosure 30 may operate to at least partially shield enclosure volume 32 from electromagnetic noise originating from exterior enclosure 30. Enclosure grounding conductor 102 may include and/or be any appropriate structure, examples of which include an electrically conductive conductor, a metallic conductor, a wire, a cable, a strap, an electrically conductive cloth, and/or a conduit.

In some examples, and as additionally schematically illustrated in FIGS. 1-3, electrical grounding assembly 100 may include objective lens grounding conductor 110 that electrically couples at least a portion of imaging device 70 (such as imaging device objective lens 80) to enclosure 30 and/or to electrical ground 12. For example, and as discussed, even when enclosure 30 is electrically grounded and/or otherwise shields enclosure volume 32 from electromagnetic radiation, inserting a portion of imaging device 70 through imaging device aperture 36 may operate to introduce electromagnetic noise into enclosure volume 32. By contrast, in an example in which the portion of imaging device 70 (such as imaging device objective lens 80) that extends into enclosure volume 32 is electrically connected to enclosure 30 by objective lens grounding conductor 110, that portion of imaging device 70 thus may be maintained at the same electric potential as enclosure 30 and/or electrical ground 12. Stated differently, in such a configuration, objective lens ground conductor 110 may provide a low-resistance path for electrical currents associated with electrical noise to propagate and/or flow away from imaging device objective lens 80. Such a configuration thus may restrict imaging device 70 from introducing electromagnetic noise into enclosure volume 32 via imaging device aperture 36.

Objective lens grounding conductor 110 may include and/or be any of a variety of structures, examples of which include an electrical conductor, a wire, a cable, a strap, an electrically conductive cloth, a polymeric grounding conductor, a metallic conductor, a fabric grounding conductor, a flexible structure, a bellows structure, and/or a conduit. Objective lens grounding conductor 110 may be electrically coupled to enclosure 30 and/or to imaging device objective lens 80 in any appropriate manner. In some examples, objective lens grounding conductor 110 is directly coupled to objective housing 82 and/or enclosure 30. In some such examples, objective lens grounding conductor 110 extends at least partially, and optionally fully, circumferentially around a component of imaging device 70 (such as imaging device objective lens 80 and/or objective housing 82). Similarly, in some examples, objective lens grounding conductor 110 extends at least partially, and optionally fully, circumferentially around imaging device aperture 36. Stated differently, in such examples, objective lens grounding conductor 110 may be operatively connected to enclosure 30 across a region of the enclosure that is adjacent to and/or at least partially, and optionally fully, surrounding imaging device aperture 36. In some examples, objective lens grounding conductor 110 is configured to be selectively and repeatedly operatively attached to and removed from imaging device objective lens 80 and/or enclosure 30.

In some examples, objective lens grounding conductor 110 is configured to permit imaging device 70 and/or imaging device objective lens 80 to move, translate, and/or rotate relative to enclosure 30 and/or DUT 22 without disrupting the electrical communication between imaging device 70 and enclosure 30. Stated differently, in some examples, such as in an example in which objective lens grounding conductor 110 is formed of a flexible material, objective lens grounding conductor 110 may be configured to remain in operative electrical contact with imaging device 70 and/or enclosure 30 as imaging device support structure 72 moves at least a portion of the imaging device relative to the enclosure and/or relative to substrate 20. For example, in the example of FIG. 2, the flexible bellows structure of objective lens grounding conductor 110 may enable the objective lens grounding conductor to deform (e.g., to reversibly deform) as imaging device 70 translates relative to enclosure 30 and/or relative to substrate 20 while maintaining operative electrical contact between imaging device objective lens 70 and enclosure 30.

FIG. 2 is a slightly less schematic illustration of a portion of an example of probe system 10 that includes objective lens grounding conductor 110. Specifically, in the example of FIG. 2, imaging device 70 includes imaging device objective lens 80 extending into enclosure volume 32 via imaging device aperture 36. In the example of FIG. 2, objective lens grounding conductor 110 (schematically illustrated in cross-section in FIG. 2) includes a flexible bellows structure that extends fully circumferentially around objective housing 82 and fully circumferentially around imaging device aperture 36. In such an example, objective lens grounding conductor 110 may operate to at least partially obstruct access to enclosure volume 32 via imaging device aperture 36.

More specifically, in such an example, objective lens grounding conductor 110 may operate to obstruct and/or restrict electromagnetic radiation within an ambient environment that surrounds enclosure 30 from entering enclosure volume 32 via imaging device aperture 36. In this manner, in the example of FIG. 2, objective lens grounding conductor 110 additionally operates to restrict and/or prevent light from entering enclosure volume 32 via imaging device aperture 36 while permitting imaging device objective lens 80 to translate relative to enclosure 30 (such as along the Z-axis illustrated in FIG. 2). Imaging device 70 of the example of FIG. 2 additionally includes objective lens isolator 88 that electrically isolates and/or insulates imaging device objective lens 80 from imaging device body 74.

While FIGS. 1-2 schematically illustrate respective aspects and/or features of probe systems 10, it is within the scope of the present disclosure that any structures, components, and/or aspects of probe systems 10 as schematically illustrated in FIG. 1 may be representative of and/or utilized in conjunction with probe systems 10 as schematically illustrated in FIG. 2, and vice-versa.

While the present disclosure generally relates to examples in which objective lens grounding conductor 110 electrically interconnects imaging device 70 and electrical ground 12 via an intermediate electrical connection to enclosure 30, this is not required, and it is additionally within the scope of the present disclosure that objective lens grounding conductor 110 may form a direct electrical connection between imaging device 70 and electrical ground 12.

In some examples, and as additionally schematically illustrated in FIGS. 1-3, electrical grounding assembly 100 includes a chuck grounding conductor 104 that electrically connects at least a portion of chuck 60 to enclosure 30 and/or to electrical ground 12. In this manner, chuck grounding conductor 104 may operate to maintain at least a portion of chuck 60, substrate 20, and/or DUT 22 at the same electric potential as enclosure 30 and/or electrical ground 12. Such a configuration thus may operate to mitigate, minimize, and/or remove from enclosure volume 32 any electromagnetic noise associated with and/or produced by chuck 60 and/or DUT 22, such as electromagnetic noise associated with the testing of DUT 22 by probe 56. Chuck grounding conductor 104 may include and/or be any appropriate structure, examples of which include a wire, a cable, a strap, an electrically conductive cloth, and/or a conduit.

In some examples, chuck 60 may include a plurality of distinct components and/or regions that are configured to be maintained at correspondingly distinct electric potentials during operative use of probe systems 10. As a more specific example, and as schematically illustrated in FIG. 1, chuck 60 may include a chuck base layer 61 that is spaced apart from chuck support surface 62 as well as a chuck guard layer 64 positioned between the chuck base layer and the chuck support surface. In such examples, chuck 60 additionally may include one or more insulating layers for at least substantially electrically isolating chuck guard layer 64 from chuck base layer 61 and/or chuck support surface 62. More specifically, in such examples, chuck 60 may include a first insulating layer positioned between chuck base layer 61 and chuck guard layer 64 and/or a second insulating layer positioned between the chuck guard layer and chuck support surface 62. In such examples, two or more of chuck base layer 61, chuck guard layer 64, and chuck support surface 62 may be configured to be maintained at distinct respective electric potentials. In such examples, chuck 60 also may be referred to as a triaxle chuck 60.

As a more specific example, chuck grounding conductor 104 may electrically connect chuck base layer 61 to enclosure 30 and/or to electrical ground 12, and chuck guard layer 64 may be configured to be maintained at least substantially at a chuck guard bias potential during operative use of probe systems 10. In some such examples, and as schematically illustrated in FIG. 1, probe systems 10 include a chuck guard potential source 14 that is configured to generate the chuck guard bias potential and/or a chuck guard potential coupling 66 that electrically connects chuck guard layer 64 and the chuck guard potential source. Additionally or alternatively, chuck support surface 62 may be configured to be maintained at least substantially at a chuck surface bias potential during operative use of probe systems 10, and/or may be electrically connected to a detector for detecting signals from DUT 22. In some such examples, and as schematically illustrated in FIG. 1, probe systems 10 include a chuck surface potential source 16 configured to generate the chuck surface bias potential and/or a chuck surface potential coupling 68 that electrically connects chuck support surface 62 and the chuck surface potential source. When present, chuck guard potential coupling 66 and/or chuck surface potential coupling 68 each may include and/or be any of a variety of electrical couplings, examples of which include a wire, a cable, and/or an electrical conductor.

In some examples, and as further schematically illustrated in FIGS. 1 and 3, electrical grounding assembly 100 includes one or more probe arm grounding conductors 120 that electrically connect each probe arm 54, or a ground conductor associated with each probe arm 54, to enclosure 30, to the corresponding probe arm slit 34, and/or to electrical ground 12. In this manner, probe arm grounding conductor 120 may operate to maintain at least a portion of probe arm 54 at the same electric potential as enclosure 30 and/or electrical ground 12, thereby restricting probe arm 54 from introducing electromagnetic noise into enclosure volume 32 via the corresponding probe arm slit 34.

Probe arm grounding conductor 120 may include and/or be any appropriate structure, examples of which include a wire, a cable, a strap, a conduit, an electrically conductive gasket, an electrically conductive cloth, and/or an electrically conductive flexible material. Probe arm grounding conductor 120 may be electrically coupled to each of probe arm 54 and enclosure 30 in any appropriate manner. As an example, probe arm 54 may include a probe cable shield that provides electromagnetic shielding to probe signals but that also may operate as an antenna to introduce electromagnetic noise into enclosure volume 32. Accordingly, in such examples, probe arm grounding conductor 120 may be electrically connected to the probe cable shield to restrict and/or prevent the electromagnetic noise from entering enclosure volume 32.

In some examples, probe arm grounding conductor 120 may include an electrically conductive gasket and/or an electrically conductive flexible material that extends between probe arm 54 and enclosure 30. In this manner, probe arm grounding conductor 120 may be configured to permit probe arm 54 and/or probe 56 to move, translate, and/or rotate relative to enclosure 30, probe arm slit 34, and/or DUT 22 without disrupting the electrical communication between probe arm 54 and enclosure 30. As a more specific example, probe arm grounding conductor 120 may include and/or be an electrically conductive material that at least substantially covers probe arm slit 34 and that is configured to engage probe arm 54 as probe arm 54 extends through probe arm slit 34.

Figure 4:
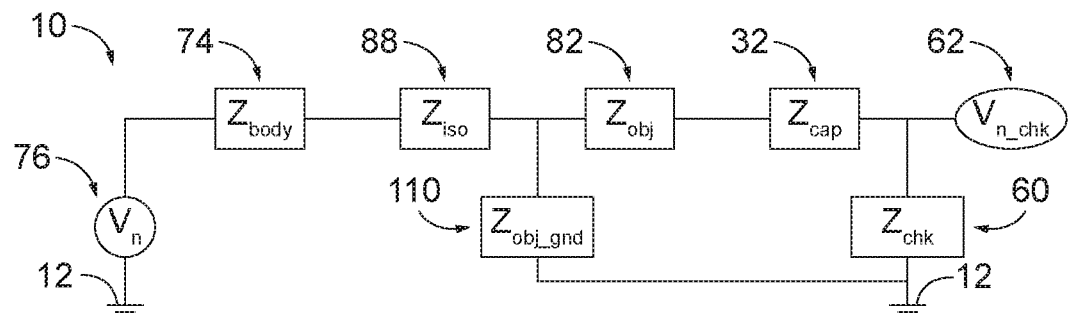
FIG. 4 is a schematic circuit diagram representing an electrical noise path corresponding to the probe system of FIG. 3.
Figure 5:
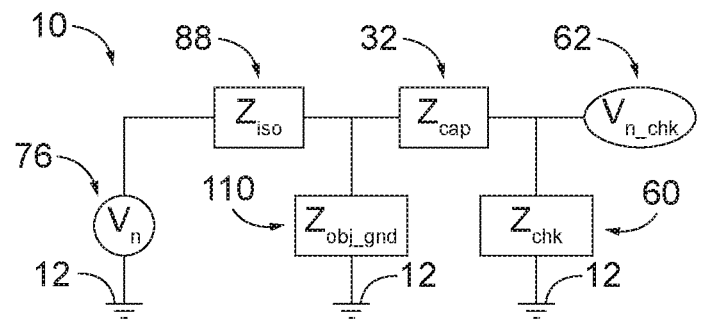
FIG. 5 is a schematic circuit diagram representing a simplified version of the schematic circuit diagram of FIG. 4.

Turning now to FIGS. 3-5, FIG. 3 is a schematic representation of aspects of probe systems 10, annotated to represent paths of electrical noise originating within imaging device body 74, while FIG. 4 is a schematic circuit representation of such paths, and FIG. 5 is a simplified version of FIG. 4, as discussed below. FIGS. 3-5 pertain to examples in which imaging device control circuitry 76 generates electrical noise voltage $V_n$, such as logic swing noise, which propagates toward chuck 60 and which results in a noise voltage $V_{n\_chk}$ at chuck support surface 62. As schematically illustrated in FIGS. 3-5, a direct electrical path between imaging device control circuitry 76 and chuck 60 encounters the following serial impedances:

$Z_{body}$, the impedance between imaging device control circuitry 76 and imaging device body 74;

$Z_{iso}$, the impedance of objective lens isolator 88;

$Z_{obj}$, the impedance of imaging device objective lens 80; and $Z_{cap}$, the impedance between imaging device objective lens 80 and chuck support surface 62, with an additional serial impedance $Z_{chk}$ of chuck 60 separating the noise voltage $V_{n\_chk}$ at chuck support surface 62 from electrical ground 12. For simplicity, in the examples of FIGS. 3-5, enclosure 30 is assumed to present zero impedance to electrical ground 12 due to enclosure grounding conductor 102 electrically connecting the enclosure to the electrical ground.

In an example in which electrical grounding assembly 100 includes objective lens grounding conductor 110, a second noise path is formed. Specifically, in such examples, and as schematically illustrated in FIGS. 3-4, objective lens grounding conductor 110 introduces an electrical path from objective lens isolator 88 to electrical ground 12, with impedance $Z_{obj\_gnd}$ corresponding to the impedance of the objective lens grounding conductor.

The schematic circuit diagram of FIG. 4 may be simplified to the schematic circuit diagram of FIG. 5 under the assumptions that $Z_{body}$ is negligible relative to $Z_{iso}$ and that $Z_{obj}$ is negligible. In particular, it is assumed that $Z_{body}$ and $Z_{iso}$ each are capacitive impedances, with $Z_{body}$ representing a capacitance that is about an order of magnitude (e.g., about 10 times) greater than the capacitance corresponding to $Z_{iso}$. Because capacitive electrical impedance is inversely proportional to capacitance, $Z_{body}$ thus is about an order of magnitude (e.g., about 10 times) smaller than $Z_{iso}$, and the series impedances $Z_{body}$ and $Z_{iso}$ may be approximated simply as $Z_{iso}$, as represented in FIG. 5. Additionally, in an example in which imaging device objective lens 80 (and/or objective housing 82 thereof) is formed of a metal, $Z_{obj}$ may be regarded as a negligible resistive impedance, and thus is omitted from the simplified schematic circuit of FIG. 5.

As will be appreciated by a person of ordinary skill in the art of electronics, the circuit schematically illustrated in FIG. 5 represents a two-stage voltage divider, which thus may result in $V_{n\_chk}$ being significantly lower than V. In particular, in this example, a first voltage divider stage of the two-stage voltage divider is a capacitor-inductor high-pass filter voltage divider formed by $Z_{iso}$ and $Z\_obj\_gnd$. Specifically, in some examples, $Z_{iso}$ may be a capacitive impedance corresponding to a capacitance of about 2-3 picofarads (pF), while $Z_{obj\_gnd}$ may be an inductive impedance corresponding to an inductance of about 50 nanohenries (nH). In such an example, the frequency-dependent voltage attenuation of the first voltage divider stage may be about 30 decibels (dB) at a noise frequency of 100 megahertz (MHz), about 70 dB at a noise frequency of 10 MHz, and about 110 dB at a noise frequency of 1 MHz.

In the example of FIG. 5, the second voltage divider stage of the two-stage voltage divider is a capacitive voltage divider formed by $Z_{cap}$ and $Z_{chk}$. Specifically, in some examples, $Z_{cap}$ may be a capacitive impedance corresponding to a capacitance of about 1 pF, and $Z_{cap}$ may be a capacitive impedance corresponding to a capacitance of about 1,000 pF. In such an example, the (frequency-independent) voltage attenuation of the second voltage divider stage may be about 60 dB. Adding the attenuations yielded by each stage of the two-stage voltage divider schematically illustrated in FIG. 5 demonstrates that the total attenuation of the circuit schematically illustrated in FIG. 5 is about 90 dB at a noise frequency of 100 MHz, about 130 dB at a noise frequency of 10 MHz, and about 170 dB at a noise frequency of 1 MHz. In this manner, utilizing probe systems 10 that include objective lens isolators 88 and/or electrical grounding assemblies 100 as disclosed herein may result in the noise voltage $V_{n\_chk}$ at chuck support surface 62 being a small fraction of the noise voltage $V_n$ produced within imaging device 70, thereby enabling testing of DUT(s) 22 with a low noise floor.

In some examples, methods of preparing probe systems 10 and/or imaging devices 70 according to the present disclosure may include assembling imaging device objective lens 80, objective lens isolator 88, and imaging device body 74 such that the imaging device objective lens is at least partially electrically isolated from the imaging device body. In some examples, assembling imaging device 70 includes operatively coupling imaging device objective lens 80 to objective lens isolator 88 and/or operatively coupling the objective lens isolator to imaging device body 74. Additionally or alternatively, assembling imaging device 70 may include positioning objective lens isolator 88 between imaging device objective lens 80 and imaging device body 74. In some examples, assembling imaging device 70 includes operatively coupling objective lens isolator 88 to each of imaging device objective lens 80 and imaging device body 74 such that the objective lens isolator maintains a spaced-apart relationship between the imaging device objective lens and the imaging device body. Similarly, in some examples, assembling imaging device 70 includes operatively coupling objective lens isolator 88 to each of imaging device objective lens 80 and imaging device body 74 such that the imaging device objective lens is electrically connected to the imaging device body only via the objective lens isolator. In some examples, assembling imaging device 70 includes assembling such that objective lens isolator 88 supports imaging device objective lens 80 (e.g., relative to enclosure 30 and/or substrate 20) and/or such that imaging device body 74 supports the objective lens isolator.

In some examples, methods of utilizing probe systems 10 according to the present disclosure may include utilizing testing assembly 50 to test DUT(s) 22 and concurrently restricting electrical noise from propagating from imaging device 70 to substrate 20. In some examples, restricting electrical noise from reaching substrate 20 includes restricting a flow of electric current from imaging device body 74 to substrate 20. For example, and as discussed, imaging device 70 and/or imaging device body 74 may include imaging device control circuitry 76 that may generate a noise voltage signal that may yield a noise electric current that flows toward substrate 20 to create a noise voltage signal that may interfere with testing of DUT(s) 22. Accordingly, methods of utilizing probe systems 10 may include restricting and/or blocking an electric current from propagating from imaging device body 74 into enclosure volume 32. As a more specific example, resisting the flow of electric current may include restricting a flow of electric current from imaging device body 74 to imaging device objective lens 80, such as by at least partially blocking the flow of electric current with objective lens isolator 88. Additionally or alternatively, restricting electrical noise from propagating from imaging device 70 to substrate 20 may include grounding imaging device objective lens 80, such as by electrically connecting objective lens grounding conductor 110 to the imaging device objective lens and to enclosure 30 and/or electrical ground 12. In some examples, utilizing probe systems 10 additionally includes, concurrently with testing DUT(s) 22, restricting electromagnetic radiation from entering enclosure volume 32 from an ambient environment extending exterior of enclosure 30. In some such examples, restricting the electromagnetic radiation from entering enclosure volume 32 is performed and/or accomplished at least partially with objective lens grounding conductor 110, such as by obstructing electromagnetic radiation from entering enclosure volume 32 via imaging device aperture 36.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase "at least substantially," when modifying a degree or relationship, includes not only the recited "substantial" degree or relationship, but also the full extent of the recited degree or relationship. A substantial amount of a recited degree or relationship may include at least 75% of the recited degree or relationship. For example, a first component that at least substantially surrounds and/or encloses a second component includes a first component that surrounds and/or encloses 75% of the second component and also includes a first component that surrounds and/or encloses an entirety of the second component.

As used herein, the terms "selective" and "selectively," when modifying an action, movement, configuration, or other activity of one or more components or characteristics of an apparatus, mean that the specific action, movement, configuration, or other activity is a direct or indirect result of one or more dynamic processes, as described herein. The terms "selective" and "selectively" thus may characterize an activity that is a direct or indirect result of user manipulation of an aspect of, or one or more components of, the apparatus, or may characterize a process that occurs automatically, such as via the mechanisms disclosed herein.

As used herein, the phrase, "for example," the phrase, "as an example," and/or simply the term "example," when used with reference to one or more components, features, details, structures, and/or embodiments according to the present disclosure, are intended to convey that the described component, feature, detail, structure, and/or embodiment is an illustrative, non-exclusive example of components, features, details, structures, and/or embodiments according to the present disclosure. Thus, the described component, feature, detail, structure, and/or embodiment is not intended to be limiting, required, or exclusive/exhaustive; and other components, features, details, structures, and/or embodiments, including structurally and/or functionally similar and/or equivalent components, features, details, structures, and/or embodiments, are also within the scope of the present disclosure.

The various disclosed elements of apparatuses and systems and steps of methods disclosed herein are not required to all apparatuses, systems, and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus, system, or method. Accordingly, such inventive subject matter is not required to be associated with the specific apparatuses, systems, and methods that are expressly disclosed herein and such inventive subject matter may find utility in apparatuses, systems, and/or methods that are not expressly disclosed herein.

Illustrative, non-exclusive examples of probe systems according to the present disclosure are presented in the following enumerated paragraphs:

A1. An imaging device configured to generate an optical image of at least a portion of a probe system, the imaging device comprising:
an imaging device objective lens;
an imaging device body that operatively supports the imaging device objective lens; and
optionally an objective lens isolator that at least partially electrically isolates at least a portion of the imaging device objective lens from the imaging device body.

A2. The imaging device of paragraph A1, wherein the imaging device includes one or more optical elements configured to receive light rays and to direct the light rays at least partially along an optical path of the imaging device that extends within the imaging device.

A3. The imaging device of paragraph A2, wherein the imaging device objective lens includes an objective housing that supports at least one of the one or more optical elements.

A4. The imaging device of paragraph A3, wherein the objective housing is at least partially formed of an electrically conductive material, optionally a metal.

A5. The imaging device of any of paragraphs A3-A4, wherein the objective housing defines at least a portion of the objective lens isolator.

A6. The imaging device of any of paragraphs A2-A5, wherein the one or more optical elements includes one or more of a lens, a tube lens, a converging lens, a diverging lens, and a mirror.

A7. The imaging device of any of paragraphs A1-A6, further comprising imaging device control circuitry configured to one or more of:
(i) generate the optical image of the portion of the probe system;
(ii) transmit the optical image of the portion of the probe system; and
(iii) receive an electrical power signal for operating at least a portion of the imaging device.

A8. The imaging device of paragraph A7, wherein the imaging device body encloses at least a portion of the imaging device control circuitry.

A9. The imaging device of any of paragraphs A7-A8, wherein the imaging device control circuitry includes an image sensor configured to collect electromagnetic radiation incident thereupon from the optical path and to generate the optical image based upon the collected electromagnetic radiation.

A10. The imaging device of any of paragraphs A1-A9, wherein an/the optical path extends from the imaging device objective lens to the imaging device body, optionally to an/the imaging device control circuitry, optionally to an/the image sensor of the imaging device control circuitry.

A11. The imaging device of any of paragraphs A1-A10, wherein the imaging device includes an infinity-corrected optical system.

A12. The imaging device of any of paragraphs A1-A11, wherein the imaging device is configured such that light rays traveling along an/the optical path within the imaging device are at least substantially collimated in at least a portion of the optical path that extends between the imaging device objective lens and the imaging device body.

A13. The imaging device of any of paragraphs A1-A12, wherein the imaging device is configured such that light rays traveling along an/the optical path within the imaging device are at least substantially collimated in a portion of the optical path that extends through the objective lens isolator.

A14. The imaging device of any of paragraphs A1-A13, wherein the imaging device includes one or more of a microscope, a microscope that includes an eyepiece, a microscope that does not include an eyepiece, a camera, a charge-coupled device, an imaging sensor, a solid state imaging device, a C-MOS imaging device, and a lens.

A15. The imaging device of any of paragraphs A1-A14, wherein the objective lens isolator is positioned at least partially, and optionally fully, between the imaging device body and the imaging device objective lens.

A16. The imaging device of any of paragraphs A1-A15, wherein the objective lens isolator at least partially, and optionally fully, spatially separates the imaging device objective lens from the imaging device body.

A17. The imaging device of any of paragraphs A1-A16, wherein the imaging device body operatively supports the imaging device objective lens via the objective lens isolator.

A18. The imaging device of any of paragraphs A1-A17, wherein the objective lens isolator is configured to restrict electrical noise from propagating from the imaging device body to the imaging device objective lens.

A19. The imaging device of any of paragraphs A1-A18, wherein the objective lens isolator supports the imaging device objective lens relative to the imaging device body, optionally wherein the objective lens isolator supports the imaging device objective lens in a position that is at least substantially fixed relative to the imaging device body.

A20. The imaging device of any of paragraphs A1-A19, wherein the objective lens isolator includes one or more of a hollow structure, a cylindrical structure, and a hollow cylindrical structure.

A21. The imaging device of any of paragraphs A1-A20, wherein the objective lens isolator is formed of one or more of an electrically insulating material, a plastic material, a dielectric material, and a thermo-plastic material.

A22. The imaging device of any of paragraphs A1-A21, wherein the objective lens isolator is formed of a material that has an electrical resistivity that is greater than an electrical resistivity of one or both of an/the imaging device objective lens and an/the imaging device body.

A23. The imaging device of any of paragraphs A1-A22, wherein the objective lens isolator is formed of a material that has an electrical resistivity that is greater than 1 Ohm-centimeter ($\Omega$-cm), optionally greater than 1,000 $\Omega$-cm, and optionally greater than 1,000,000 $\Omega$-cm.

A24. The imaging device of any of paragraphs A1-A23, wherein the objective lens isolator is formed of a material that has a dielectric constant that is less than 50, optionally less than 10, optionally less than 5, and optionally less than 2.

A25. The imaging device of any of paragraphs A1-A24, wherein the objective lens isolator encloses a portion of an/the optical path between the imaging device objective lens and the imaging device body.

A26. The imaging device of paragraph A25, wherein the optical path extends at least partially, and optionally fully, through the objective lens isolator.

A27. The imaging device of paragraph A26, wherein the objective lens isolator encloses an isolator cavity; and wherein the optical path extends within the isolator cavity.

B1. A probe system, comprising:
an enclosure that at least partially defines an enclosure volume that is configured to at least substantially enclose a substrate that includes one or more devices under test (DUTs);
a testing assembly configured to test the one or more DUTs; and
an imaging device configured to generate an optical image of at least a portion of the probe system;
wherein at least a portion of an imaging device objective lens of the imaging device extends at least partially within the enclosure, and optionally extends within the enclosure volume; and wherein the imaging device is the imaging device of any of paragraphs A1-A27.

B2. The probe system of paragraph B1, wherein the imaging device is configured to generate an optical image of at least a portion of the testing assembly, optionally at least a portion of at least one of one or more probes of the testing assembly.

B3. The probe system of any of paragraphs B1-B2, wherein the imaging device is configured to generate an optical image of at least a portion of the substrate, optionally at least a portion of the one or more DUTs.

B4. The probe system of any of paragraphs B1-B3, further comprising an electrical grounding assembly configured to restrict electromagnetic noise from entering the enclosure volume.

B5. The probe system of paragraph B4, wherein the electrical grounding assembly is configured to provide an electrical connection between one or more components of the probe system and an electrical ground.

B6. The probe system of any of paragraphs B4-B5, wherein the electrical grounding assembly includes an enclosure grounding conductor that electrically connects the enclosure to an/the electrical ground.

B7. The probe system of paragraph B6, wherein the enclosure grounding conductor includes one or more of a wire, a cable, a strap, an electrically conductive cloth, and a conduit.

B8. The probe system of any of paragraphs B1-B7, wherein the enclosure is one or more of an electrically conductive enclosure, a metallic enclosure, an electrically shielded enclosure, and an electromagnetically shielded enclosure.

B9. The probe system of any of paragraphs B1-B8, wherein the enclosure includes one or more walls that at least partially bound the enclosure volume.

B10. The probe system of any of paragraphs B1-B9, further comprising an imaging device support structure that supports at least a portion of the imaging device relative to the enclosure; optionally wherein the imaging device support structure is configured to selectively translate and/or rotate at least a portion of the imaging device relative to one or both of the enclosure and the substrate during operative use of the probe system.

B11. The probe system of paragraph B10, wherein an/the imaging device control circuitry is configured to control operation of the imaging device support structure to selectively reposition at least a portion of the imaging device relative to one or both of the enclosure and the substrate.

B12. The probe system of any of paragraphs B10-B11, wherein the imaging device body includes the imaging device support structure.

B13. The probe system of any of paragraphs B10-B12, wherein the imaging device support structure is configured to selectively translate and/or rotate the imaging device objective lens relative to at least a portion of the imaging device body.

B14. The probe system of any of paragraphs B1-B13, wherein the imaging device body is positioned at least partially exterior of the enclosure volume, and wherein the imaging device objective lens extends at least partially into the enclosure, optionally wherein the imaging device objective lens extends at least partially within the enclosure volume.

B15. The probe system of paragraph B14, wherein a/the imaging device support structure supports the imaging device body exterior of the enclosure volume.

B16. The probe system of any of paragraphs B1-B15, wherein the enclosure includes an imaging device aperture, and wherein the imaging device objective lens extends at least partially within the imaging device aperture, optionally wherein the imaging device objective lens extends fully through the imaging device aperture, optionally wherein the imaging device objective lens extends into the enclosure volume via the imaging device aperture.

B17. The probe system of any of paragraphs B1-B16, wherein at least a portion of a/the objective lens isolator is positioned exterior of the enclosure volume.

B18. The probe system of any of paragraphs B1-B17, when dependent from paragraph B4, wherein the electrical grounding assembly includes an objective lens grounding conductor that electrically connects at least a portion of the imaging device, optionally the imaging device objective lens, to one or both of the enclosure and an/the electrical ground.

B19. The probe system of paragraph B18, wherein the objective lens grounding conductor is directly coupled to one or both of an/the objective housing and the enclosure.

B20. The probe system of any of paragraphs B18-B19, wherein the objective lens grounding conductor extends at least partially, optionally at least substantially, and optionally fully, circumferentially around the imaging device objective lens.

B21. The probe system of any of paragraphs B18-B20, wherein the objective lens grounding conductor extends at least partially, optionally at least substantially, and optionally fully, circumferentially around an/the imaging device aperture.

B22. The probe system of any of paragraphs B18-B21, wherein the objective lens grounding conductor restricts electromagnetic radiation within an ambient environment that surrounds the enclosure from entering the enclosure volume via an/the imaging device aperture.

B23. The probe system of any of paragraphs B18-B22, wherein the objective lens grounding conductor is configured to be selectively and repeatedly operatively attached to and removed from one or both of the imaging device objective lens and the enclosure.

B24. The probe system of any of paragraphs B18-B23, wherein the objective lens grounding conductor includes one or more of an electrical conductor, a wire, a cable, a strap, an electrically conductive cloth, a polymeric grounding conductor, a metallic grounding conductor, a fabric grounding conductor, a flexible structure, a bellows structure, and a conduit.

B25. The probe system of any of paragraphs B18-B24, wherein the objective lens grounding conductor is configured to remain in operative electrical contact with one or both of the imaging device and the enclosure as a/the imaging device support structure translates and/or rotates at least a portion of the imaging device relative to one or both of the enclosure and the substrate.

B26. The probe system of any of paragraphs B18-B25, wherein the objective lens grounding conductor is directly coupled to each of an/the objective housing and the enclosure; and wherein the objective lens grounding conductor is configured to deform, optionally to reversibly deform, as the imaging device translates relative to the enclosure.

B27. The probe system of any of paragraphs B1-B26, wherein the DUT includes, and optionally is, one or more of a semiconductor device, an electronic device, an optical device, an imaging device, a CMOS image sensor, a charge-coupled device (CCD) sensor, a logic device, a power device, a switching device, and a transistor.

B28. The probe system of any of paragraphs B1-B27, wherein the testing assembly is configured to one or both of:
(i) provide a test signal to the one or more DUTs; and
(ii) receive a resultant signal from the one or more DUTs.

B29. The probe system of any of paragraphs B1-B28, wherein the testing assembly includes:
one or more probe arms;
one or more probes, each probe including a corresponding one or more probe tips and being supported by a corresponding probe arm of the one or more probe arms; and
one or more manipulators for positioning the one or more probes relative to the one or more DUTs.

B30. The probe system of paragraph B29, wherein each probe of the one or more probes is configured to provide a/the test signal to a corresponding DUT of the one or more DUTs and/or to receive a/the resultant signal from the corresponding DUT of the one or more DUTs.

B31. The probe system of any of paragraphs B29-B30, wherein each probe tip of the one or more probe tips is configured to provide a/the test signal to a corresponding DUT of the one or more DUTs and/or to receive a/the resultant signal from the corresponding DUT of the one or more DUTs.

B32. The probe system of any of paragraphs B29-B31, wherein at least one probe of the one or more probes is configured to contact the corresponding DUT of the one or more DUTs during operative use of the probe system, optionally wherein at least one probe tip of the one or more probe tips is configured to contact the corresponding DUT of the one or more DUTs during operative use of the probe system, optionally wherein at least one probe tip of the one or more probe tips is configured to electrically contact the corresponding DUT of the one or more DUTs during operative use of the probe system.

B33. The probe system of any of paragraphs B1-B32, wherein at least one probe of the one or more probes is configured for non-contact testing of the corresponding DUT of the one or more DUTs.

B34. The probe system of paragraph B33, wherein at least one probe tip of the one or more probe tips is configured to be spaced apart from the corresponding DUT of the one or more DUTs during operative use of the probe system.

B35. The probe system of any of paragraphs B29-B34, wherein the one or more probe tips includes a plurality of probe tips, optionally wherein the one or more probes includes a plurality of probes; and wherein the testing assembly includes a probe head assembly that includes one or both of:
(i) the plurality of probe tips; and
(ii) the plurality of probes.

B36. The probe system of any of paragraphs B29-B35, wherein each manipulator of the one or more manipulators is configured to operatively translate a respective probe of the one or more probes through a probe range-of-motion to translate a respective probe tip of the one or more probe tips relative to the one or more DUTs.

B37. The probe system of any of paragraphs B29-B36, wherein each manipulator of the one or more manipulators is configured to maintain an at least substantially fixed relative orientation among two or more of the respective probe of the one or more probes, a respective probe arm of the one or more probe arms that supports the respective probe of the one or more probes, the respective probe tip of the one or more probe tips, and at least one DUT of the one or more DUTs during operative use of the probe system.

B38. The probe system of any of paragraphs B29-B37, wherein at least one manipulator of the one or more manipulators one or more of:
(i) directly engages the enclosure;
(ii) is operatively attached to the enclosure; and
(iii) is at least partially supported by the enclosure.

B39. The probe system of any of paragraphs B29-B38, wherein at least one manipulator of the one or more manipulators is spatially separated from the enclosure.

B40. The probe system of any of paragraphs B29-B39, wherein each manipulator of the one or more manipulators is external to the enclosure volume, wherein each probe of the one or more probes is oriented within the enclosure volume, and wherein each probe arm of the one or more probe arms operatively connects a respective probe of the one or more probes and a respective manipulator of the one or more manipulators.

B41. The probe system of any of paragraphs B29-B40, wherein the enclosure includes one or more probe arm slits, and wherein each probe arm of the one or more probe arms extends through a corresponding probe arm slit of the one or more probe arm slits.

B42. The probe system of any of paragraphs B29-B41, when dependent from paragraph B4, wherein the electrical grounding assembly includes one or more probe arm grounding conductors that electrically connect each probe arm and/or a ground conductor associated with each probe arm to one or more of the enclosure, a/the corresponding probe arm slit of the one or more probe arm slits, and a/the electrical ground.

B43. The probe system of paragraph B42, wherein the probe arm grounding conductor includes one or more of a wire, a cable, a strap, a conduit, an electrically conductive gasket, an electrically conductive cloth, and an electrically conductive flexible material.

B44. The probe system of any of paragraphs B1-B43, further comprising a signal generation and analysis assembly configured to provide a/the test signal to the testing assembly and/or to receive a/the resultant signal from the testing assembly.

B45. The probe system of any of paragraphs B1-B44, further comprising a chuck with a chuck support surface configured to support the substrate.

B46. The probe system of paragraph B45, further comprising a translation stage with a translation stage support surface that supports the chuck, wherein the translation stage is configured to operatively translate and/or rotate the chuck relative to a/the one or more probes.

B47. The probe system of any of paragraphs B45-B46, wherein the electrical grounding assembly includes a chuck grounding conductor that electrically connects at least a portion of the chuck to one or both of the enclosure and a/the electrical ground.

B48. The probe system of paragraph B47, wherein the chuck grounding conductor includes one or more of a wire, a cable, a strap, an electrically conductive cloth, and a conduit.

B49. The probe system of any of paragraphs B45-B48, wherein the chuck includes:
a chuck base layer; and
a chuck guard layer positioned between the chuck base layer and the chuck support surface; and
wherein two or more of the chuck base layer, the chuck guard layer, and the chuck support surface are configured to be maintained at distinct electric potentials.

B50. The probe system of paragraph B49, when dependent from paragraph B47, wherein the chuck grounding conductor electrically connects the chuck base layer to one or both of the enclosure and the electrical ground.

B51. The probe system of any of paragraphs B49-B50, wherein the chuck guard layer is configured to be maintained at least substantially at a chuck guard bias potential during operative use of the probe system; and wherein the probe system further includes one or both of:
a chuck guard potential source configured to generate the chuck guard bias potential; and
a chuck guard potential coupling that electrically connects the chuck guard layer and the chuck guard potential source.

B52. The probe system of paragraph B51, wherein the chuck guard potential coupling includes, and optionally is, one or more of a wire, a cable, and an electrical conductor.

B53. The probe system of any of paragraphs B45-B52, wherein the chuck support surface is configured to be maintained at least substantially at a chuck surface bias potential during operative use of the probe system; and wherein the probe system further includes one or both of:
a chuck surface potential source configured to generate the chuck surface bias potential; and
a chuck surface potential coupling that electrically connects the chuck support surface and the chuck surface potential source.

B54. The probe system of paragraph B53, wherein the chuck surface potential coupling includes, and optionally is, one or more of a wire, a cable, and an electrical conductor.

C1. A method of preparing an imaging device, the method comprising:
assembling the imaging device such that an imaging device objective lens of the imaging device is at least partially electrically isolated from an imaging device body of the imaging device;
optionally wherein the imaging device is one or both of:
(i) the imaging device of any of paragraphs A1-A27; and
(ii) the imaging device of the probe system of any of paragraphs B1-B54.

C2. The method of paragraph C1, wherein the assembling the imaging device includes one or more of:
(i) operatively coupling the imaging device objective lens to the objective lens isolator;
(ii) positioning the objective lens isolator between the imaging device objective lens and the imaging device body; and
(iii) operatively coupling the objective lens isolator to the imaging device body.

C3. The method of any of paragraphs C1-C2, wherein the assembling the imaging device includes operatively coupling the objective lens isolator to each of the imaging device objective lens and the imaging device body such that the objective lens isolator maintains a spaced-apart relationship between the imaging device objective lens and the imaging device body.

C4. The method of any of paragraphs C1-C3, wherein the assembling the imaging device includes operatively coupling the objective lens isolator to each of the imaging device objective lens and the imaging device body such that the imaging device objective lens is electrically connected to the imaging device body only via the objective lens isolator.

C5. The method of any of paragraphs C1-C4, wherein the assembling the imaging device includes assembling such that one or both of:
(i) the objective lens isolator supports the imaging device objective lens; and
(ii) the imaging device body supports the objective lens isolator.

D1. A method of utilizing a probe system, the method comprising:
(i) testing, with a testing assembly of the probe system, one or more devices under test (DUTs); and
(ii) concurrently with the testing the one or more DUTs, restricting electrical noise from propagating from an imaging device of the probe system to a substrate that includes the one or more DUTs;
optionally wherein the probe system is the probe system of any of paragraphs B1-B54.

D2. The method of paragraph D1, wherein the restricting the electrical noise includes restricting a flow of electric current from the imaging device body to the imaging device objective lens.

D3. The method of any of paragraphs D1-D2, wherein the restricting the flow of electric current from the imaging device body to the imaging device objective lens includes at least partially blocking the flow of electric current with the objective lens isolator.

D4. The method of any of paragraphs D1-D3, wherein the restricting the electrical noise includes grounding the imaging device objective lens.

D5. The method of paragraph D4, wherein the grounding the imaging device objective lens includes electrically connecting a/the objective lens grounding conductor to the imaging device objective lens and to one or both of the enclosure and a/the electrical ground.

D6. The method of any of paragraphs D1-D5, further comprising, concurrently with the testing the one or more DUTs, restricting electromagnetic radiation from entering the enclosure volume from an ambient environment that extends exterior of the enclosure, optionally with a/the objective lens grounding conductor.

INDUSTRIAL APPLICABILITY

The imaging devices and probe systems disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements, and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system, comprising:
an enclosure that at least partially defines an enclosure volume configured to at least substantially enclose a substrate that includes one or more devices under test (DUTs);
a testing assembly configured to test the one or more DUTs;
an imaging device configured to generate an optical image of at least a portion of the probe system, wherein the imaging device includes:
(i) an imaging device objective lens that extends at least partially within the enclosure;
(ii) an imaging device body that operatively supports the imaging device objective lens and that is positioned at least partially exterior of the enclosure volume; and
(iii) an objective lens isolator that at least partially electrically isolates the imaging device objective lens from the imaging device body; and
an electrical grounding assembly configured to restrict electromagnetic noise from entering the enclosure volume; wherein the electrical grounding assembly includes an objective lens grounding conductor that electrically connects the imaging device objective lens to an electrical ground; and wherein the objective lens grounding conductor extends at least substantially circumferentially around the imaging device objective lens.

2. The probe system of claim 1, further comprising a chuck with a chuck support surface configured to support the substrate; and wherein the electrical grounding assembly includes a chuck grounding conductor that electrically connects at least a portion of the chuck to one or both of the enclosure and the electrical ground.

3. The probe system of claim 2, wherein the chuck includes:
a chuck base layer; and
a chuck guard layer positioned between the chuck base layer and the chuck support surface;
wherein two or more of the chuck base layer, the chuck guard layer, and the chuck support surface are configured to be maintained at unique electric potentials; and wherein the chuck grounding conductor electrically connects the chuck base layer to one or both of the enclosure and the electrical ground.

4. A probe system, comprising:
an enclosure that at least partially defines an enclosure volume configured to at least substantially enclose a substrate that includes one or more devices under test (DUTs);
a testing assembly configured to test the one or more DUTs;
an imaging device configured to generate an optical image of at least a portion of the probe system, wherein the imaging device includes:
(i) an imaging device objective lens that extends at least partially within the enclosure;
(ii) an imaging device body that operatively supports the imaging device objective lens and that is positioned at least partially exterior of the enclosure volume; and
(iii) an objective lens isolator that at least partially electrically isolates the imaging device objective lens from the imaging device body.

5. The probe system of claim 4, wherein the objective lens isolator supports the imaging device objective lens in a position that is at least substantially fixed relative to the imaging device body.

6. The probe system of claim 4, wherein at least a portion of the objective lens isolator is positioned exterior of the enclosure volume.

7. The probe system of claim 4, wherein the objective lens isolator includes one or more of a hollow structure and a cylindrical structure; and wherein the objective lens isolator is formed of one or more of an electrically insulating material, a plastic material, and a thermo-plastic material.

8. The probe system of claim 4, wherein the imaging device objective lens includes:
one or more optical elements configured to receive light rays and to direct the light rays at least partially along an optical path of the imaging device that extends within the imaging device from the imaging device objective lens to the imaging device body; and
an objective housing that supports the one or more optical elements; and
wherein the objective lens isolator encloses a portion of the optical path between the imaging device objective lens and the imaging device body.

9. The probe system of claim 8, wherein the imaging device includes an infinity-corrected optical system; and wherein the imaging device is configured such that light rays traveling along an optical path within the imaging device are at least substantially collimated in a portion of the optical path that extends through the objective lens isolator.

10. The probe system of claim 4, further comprising an electrical grounding assembly configured to restrict electromagnetic noise from entering the enclosure volume; wherein the electrical grounding assembly includes an objective lens grounding conductor that electrically connects the imaging device objective lens to an electrical ground.

11. The probe system of claim 10, wherein the electrical grounding assembly includes an enclosure grounding conductor that electrically connects the enclosure to the electrical ground; and wherein the objective lens grounding conductor electrically connects the imaging device objective lens to the enclosure.

12. The probe system of claim 10, further comprising an imaging device support structure that supports at least a portion of the imaging device relative to the enclosure; wherein the imaging device support structure is configured to selectively translate the imaging device objective lens relative to the enclosure during operative use of the probe system; and wherein the objective lens grounding conductor is configured to remain in operative electrical contact with each of the imaging device and the enclosure as the imaging device support structure translates the imaging device objective lens relative to the enclosure during operative use of the probe system.

13. The probe system of claim 12, wherein the objective lens grounding conductor is configured to deform as the imaging device support structure translates the imaging device objective lens relative to the enclosure.

14. The probe system of claim 10, wherein the objective lens grounding conductor extends at least substantially circumferentially around the imaging device objective lens.

15. The probe system of claim 10, wherein the enclosure includes an imaging device aperture; wherein the imaging device objective lens extends at least partially within the imaging device aperture; and wherein the objective lens grounding conductor extends at least substantially circumferentially around the imaging device aperture.

16. The probe system of claim 10, wherein the objective lens grounding conductor is configured to be selectively and repeatedly operatively attached to and removed from one or both of the imaging device objective lens and the enclosure.

17. The probe system of claim 4, wherein the testing assembly includes:
one or more probe arms;
one or more probes, each probe including corresponding one or more probe tips and being supported by a corresponding probe arm of the one or more probe arms; and
one or more manipulators for positioning the one or more probes relative to the one or more DUTs, each manipulator of the one or more manipulators configured to operatively translate a respective probe of the one or more probes through a probe range-of-motion to translate a respective probe tip of the one or more probe tips relative to the one or more DUTs;
wherein each manipulator of the one or more manipulators is external to the enclosure volume; wherein each probe of the one or more probes is oriented within the enclosure volume; wherein each probe arm of the one or more probe arms operatively connects a respective probe of the one or more probes and a respective manipulator of the one or more manipulators; wherein the enclosure includes one or more probe arm slits; and wherein each probe arm of the one or more probe arms extends through a corresponding probe arm slit of the one or more probe arm slits.

18. The probe system of claim 17, further comprising an electrical grounding assembly configured to restrict electromagnetic noise from entering the enclosure volume; wherein the electrical grounding assembly includes one or more probe arm grounding conductors that electrically connect each probe arm to the corresponding probe arm slit of the one or more probe arm slits.

19. A method of preparing the imaging device of the probe system of claim 4, the method comprising:
assembling the imaging device such that the imaging device objective lens is at least partially electrically isolated from the imaging device body; wherein the assembling the imaging device includes:
(i) operatively coupling the imaging device objective lens to the objective lens isolator;
(ii) positioning the objective lens isolator between the imaging device objective lens and the imaging device body; and
(iii) operatively coupling the objective lens isolator to the imaging device body.

20. A method of utilizing a probe system, the method comprising:
(i) testing, with a testing assembly of the probe system, one or more devices under test (DUTs); and
(ii) concurrently with the testing the one or more DUTs, restricting electrical noise from propagating from an imaging device of the probe system to a substrate that includes the one or more DUTs;
wherein the restricting the electrical noise includes:
(i) restricting a flow of electric current from an imaging device body of the imaging device to an imaging device objective lens of the imaging device; and
(ii) grounding the imaging device objective lens.

* * * * *